(12) United States Patent
Ikezawa et al.

(10) Patent No.: US 6,593,663 B2
(45) Date of Patent: Jul. 15, 2003

(54) ELECTRONIC DEVICE INCLUDING STACKED MICROCHIPS

(75) Inventors: Toshiya Ikezawa, Kariya (JP); Masaaki Tanaka, Kariya (JP); Takashige Saitou, Ama-gun (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/187,952

(22) Filed: Jul. 3, 2002

(65) Prior Publication Data

US 2003/0006508 A1 Jan. 9, 2003

(30) Foreign Application Priority Data

Jul. 6, 2001 (JP) ......................................... 2001-206684

(51) Int. Cl.$^7$ ............................................. H01L 29/40
(52) U.S. Cl. ........................ 257/777; 257/783; 257/791
(58) Field of Search ................................. 257/783, 777, 257/729, 782, 785, 791

(56) References Cited

U.S. PATENT DOCUMENTS 5,483,106 A * 1/1996 Echigo et al. ............... 257/783

FOREIGN PATENT DOCUMENTS

| EP | 0 301 892 | * 7/1989 | ........... H01L/23/14 |
|---|---|---|---|
| JP | 57-15455 | * 1/1982 | ................ 257/786 |
| JP | A-61-34085 | 2/1986 | |
| JP | A-62-228926 | 10/1987 | |
| JP | A-4-335540 | 11/1992 | |
| JP | A-6-120527 | 4/1994 | |
| JP | A-10-270497 | 10/1998 | |
| JP | A-11-326085 | 11/1999 | |

* cited by examiner

Primary Examiner—Jasmine J B Clark
(74) Attorney, Agent, or Firm—Posz & Bethards, PLC

(57) ABSTRACT

An electronic device includes two microchips and a bonding layer with which the microchips are bonded together. The bonding layer is a silicone-type adhesive film, which has a glass transition temperature higher than +120° C. or lower than −40° C. Therefore, the influence of the variation in the elastic modulus of the bonding layer due to the glass transition on the electronic characteristic of one of the microchips is substantially eliminated in the temperature range between −40° C. and +120° C. Moreover, the elastic modulus in the temperature range between −40° C. and +120° C. is lowered. Therefore, the influence of a thermal stress in the one of the microchips on the electronic characteristic is suppressed.

6 Claims, 4 Drawing Sheets

ELECTRONIC DEVICE INCLUDING STACKED MICROCHIPS

CROSS REFERENCE TO RELATED APPLICATION

This application is based on and incorporates herein by reference Japanese Patent Application No. 2001-206684 filed on Jul. 6, 2001.

BACKGROUND OF THE INVENTION

The present invention relates to an electronic device in which a plurality of microchips are stacked.

As an electronic device of this type, an acceleration sensor (accelerometer), which includes a processing microchip, a sensing microchip, and a housing, is proposed. The acceleration sensor is used under such thermally harsh condition as in a vehicle, in which the temperature of the sensor in use ranges between −40° C. and +120° C.

The processing microchip, which is located in the housing, has a bonding area. On the bonding area, the sensing microchip is located. The sensing microchip includes a substrate made of semiconductor such as silicon and a sensing region, which is located in the substrate. The sensing region is for sensing an acceleration of a target object, which is a velocity change rate of the target object. When the velocity of the target object increases, the acceleration is positive, and when the velocity decreases, the acceleration is negative. Positive and negative accelerations can be detected in the same manner, so hereinafter explanation will be made only for the case that positive acceleration is detected.

In the proposed acceleration sensor, the processing microchip and the sensing microchip are bonded together by a polyimide-type adhesive film. However, as shown in FIG. 5, the elastic modulus of the polyimide-type adhesive film changes relatively significantly at approximately 110° C. due to the glass transition of the polyimide-type adhesive film. Therefore, the sensing precision of the sensing microchip is undesirably lowered by the relatively significant change in the elastic modulus of the polyimide-type adhesive film.

The proposed acceleration sensor can cover various acceleration ranges (dynamic range) by combining the sensitivity (output signal per unit acceleration) of the sensing microchip and an amplification factor of the processing microchip. To be specific, the proposed acceleration sensor can cover various acceleration ranges from a minimum range of 0 g's–0.3 g's to a maximum range of 0 g's–250 g's (the unit g is the acceleration of gravity). However, in the case that the proposed acceleration sensor is designed to cover a relatively low acceleration range, for example, in the case that the upper detection limit of acceleration is in the range between 0.3 g's and 1.5 g's, the sensing precision of the sensing microchip is seriously lowered by the change in the elastic modulus of the polyimide-type adhesive film.

In the case that the proposed acceleration sensor outputs a maximum of 5V in the dynamic range covered by the proposed acceleration sensor and the upper detection limit is 50 g's and the deviation in output signal from the proposed acceleration sensor is $D_{vol}$ (V), the output signal (V) per unit acceleration (g) is $0.1+0.02D_{vol}$ (V/g). In the case that the upper detection limit is 1.5 g's, the output signal (V) per unit acceleration (g) is $3.3+0.67D_{vol}$ (V/g). The sensing precision is seriously lowered by the change in the elastic modulus of the polyimide-type adhesive film when the proposed acceleration sensor has such relatively high sensitivity as in the later case.

SUMMARY OF THE INVENTION

The present invention has been made in view of the above aspects with an object to provide an electronic device, which includes two microchips and a bonding layer with which the microchips are bonded together, and in which the influence of the elastic modulus of the bonding layer on an electronic characteristic of one of the microchips is preferably suppressed.

In the present invention, the bonding layer is a silicone-type adhesive film, which has a glass transition temperature higher than +120° C. or lower than −40° C. Therefore, the influence of the variation in the elastic modulus of the bonding layer due to the glass transition on the electronic characteristic is substantially eliminated in the temperature range between −40° C. and +120° C. Moreover, the elastic modulus in the temperature range between −40° C. and +120° C. is lowered. Therefore, the influence of a thermal stress in the one of the microchips on the electronic characteristic is suppressed.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

The present invention will be described in detail with reference to an embodiment and various modifications of the embodiment.

Embodiment

Figure 1:
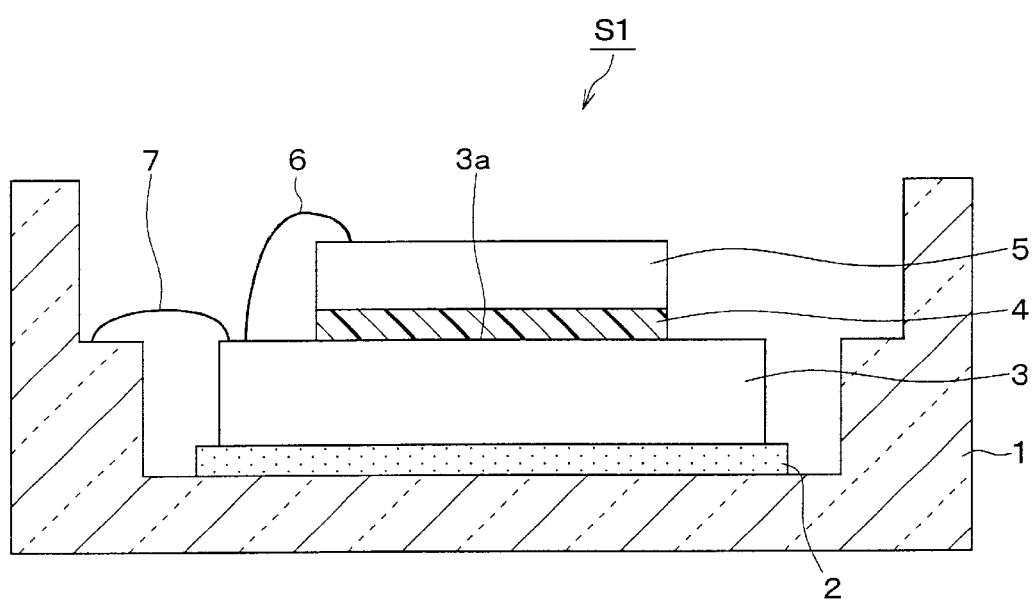
FIG. 1 is a schematic cross-sectional view of an acceleration sensor according to the embodiment of the present invention.

An electronic device shown in FIG. 1 is an acceleration sensor S1 that can be used under such thermally harsh condition as in a vehicle, in which the temperature of the sensors in use ranges between −40° C. and +120° C. The acceleration sensor S1 includes a processing microchip 3

(first microchip), a sensing microchip 5 (second microchip), and a housing 1. The housing 1 includes a ceramic body and a wiring member for electric connection. The housing 1 is used not only to accommodate the processing microchip 3 and the sensing microchip 5 but also to mount the acceleration sensor S1 on a target object and also to transmit an electric signal from the processing microchip 3. As shown in FIG. 1, the processing microchip 3 has a bonding area 3a, and the sensing microchip 5 is located on the bonding area 3a of the processing microchip 3, which is located in the housing 1. In the acceleration sensor S1 in FIG. 1, the processing microchip 3 and the housing 1 are bonded by an adhesive 2 made of a silicone-type resin, and the sensing microchip 5 and the processing microchip 3 are bonded by an adhesive film 4 (bonding layer).

The sensing microchip 5 includes a substrate made of semiconductor such as silicon and a sensing region. Although not shown, the sensing region is located in the substrate to sense an acceleration of the target object. Although not shown, the sensing region includes a movable electrode and a fixed electrode. Each electrode has cantilevers, which are in the shape of comb teeth, and the two set of cantilevers mesh with each other. Each cantilever of the movable electrode relatively moves to vary the capacitance between the movable electrode and the fixed electrode when the velocity of the target object increases or decreases. The acceleration of the target object is detected on the basis of the variation in the capacitance.

The processing microchip 3 includes a substrate made of semiconductor such as silicon and a processing region. Although not shown, the processing region includes a C/V transducing circuit and is located in the substrate to process a capacitive signal from the sensing microchip 5. The C/V transducing circuit is formed using transistors such as a MOSFET and a bipolar transistor, which are formed with a semiconductor manufacturing process in a known manner. As shown in FIG. 1, the sensing microchip 5 and the processing microchip 3 are electrically connected with a bonding wire 6, and the processing microchip 3 and the housing 1 are electrically connected with a bonding wire 7. The capacitive signal is transmitted from the sensing microchip 5 to the processing microchip 3 through the bonding wire 6, and the capacitive signal is transduced to a potential signal by the C/V transducing circuit. Then, the potential signal is output to the housing 1 through the bonding wire 7.

Figure 2:
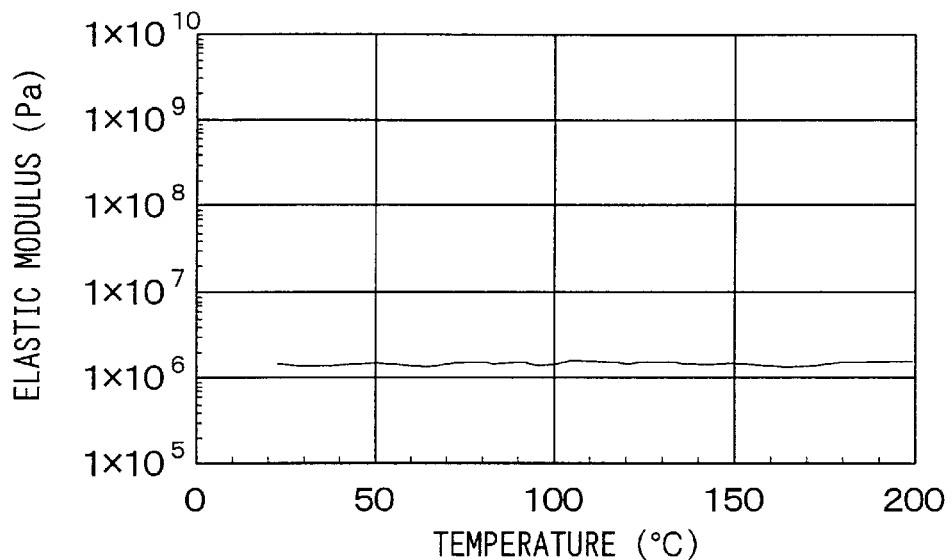
FIG. 2 is a graph showing the correlation between the elastic modulus of a silicone-type adhesive film and temperature.

The adhesive film 4, which is used to bond the sensing microchip 5 and the processing microchip 3, is a silicone-type adhesive film, which is made of silicone resin having a glass transition temperature of approximately −100° C. Therefore, the influence of the variation in the elastic modulus of the adhesive film 4 due to the glass transition on the sensing precision of the sensing microchip 5 is substantially eliminated at least in the temperature range between −40° C. and +120° C. Moreover, the elastic modulus of the adhesive film 4 is approximately 1 MPa and substantially constant at least in the temperature range between −40° C. and +120° C., as shown in FIG. 2, in which the elastic modulus is shown between +20° C. and 200° C. Therefore, the thermal stress, which is caused by temperature difference between the microchips 3, 5, in the sensing microchip 5 is relatively low in the temperature range between −40° C. and +120° C., and the influence of the thermal stress on the sensing precision of the sensing microchip 5 is suppressed. Instead of the silicone resin, it is possible to use other materials that have a glass transition temperature higher than +120° C. or lower than −40° C. and an elastic modulus between 1 MPa and 10 MPa in the temperature range between −40° C. and +120° C. The other materials are epoxy resin, polyimide resin, acrylic resin, urethane resin, rubber, liquid crystal polymer, and so on.

Figure 3:
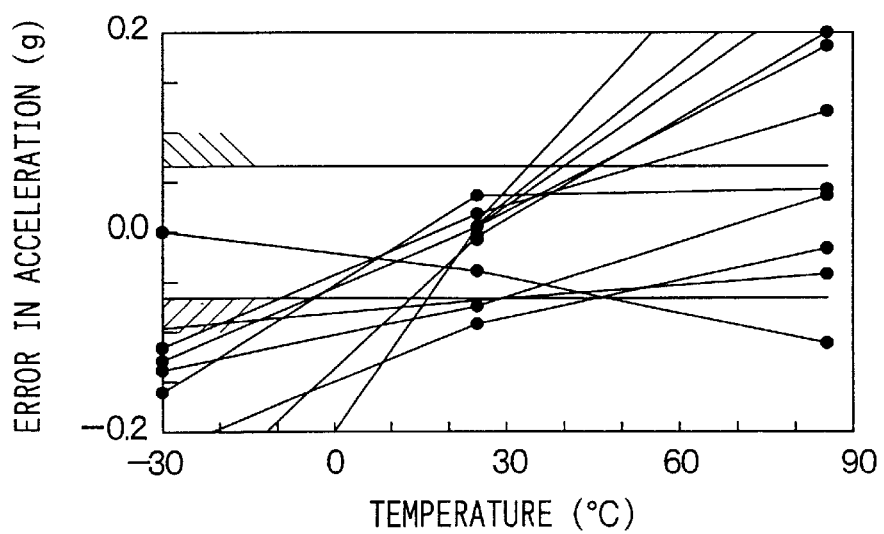
FIG. 3 is a graph showing the correlation between the initial error in acceleration and temperature of a reference acceleration sensor including a polyimide-type adhesive film.
Figure 4:
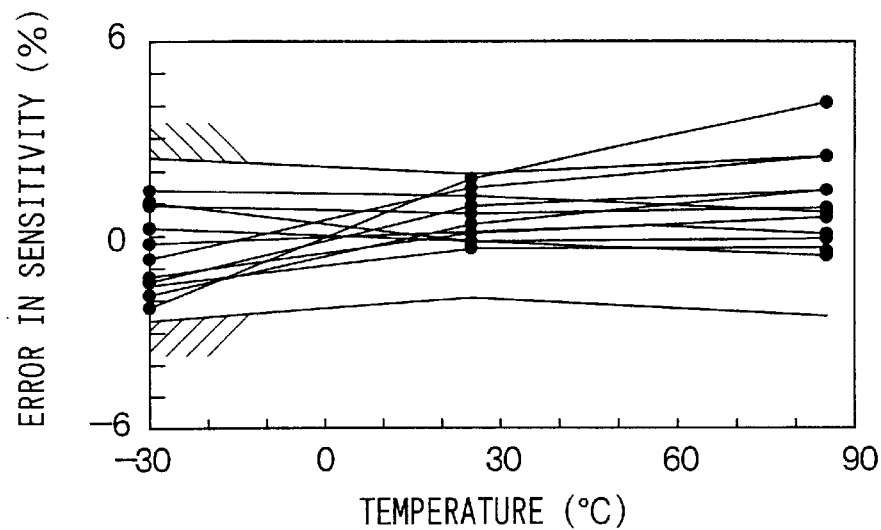
FIG. 4 is a graph showing the correlation between the initial error in sensitivity and temperature of the reference acceleration sensor.
Figure 5:
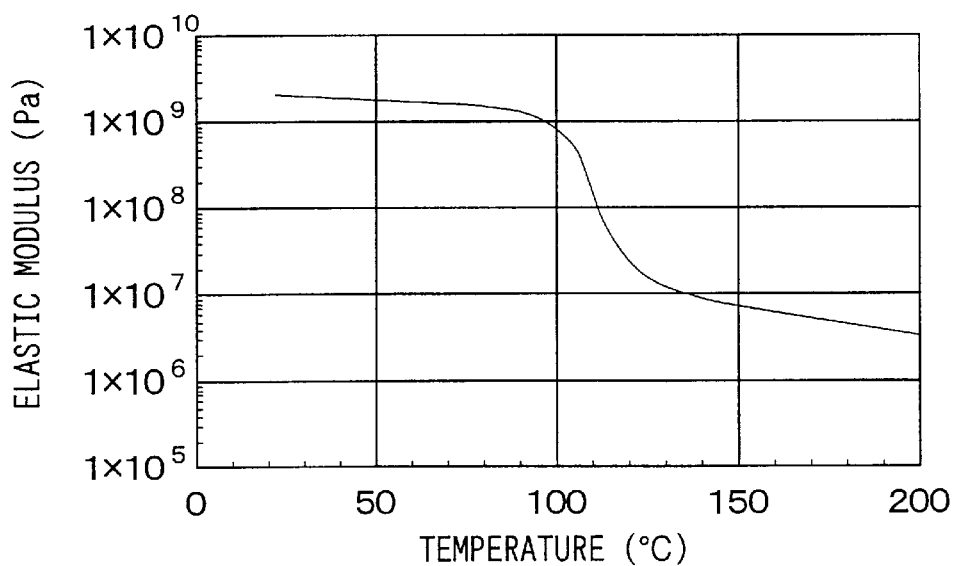
FIG. 5 is a graph showing the correlation between the elastic modulus of the polyimide-type adhesive film and temperature.

The cantilevers of the movable electrode, which relatively move to vary the capacitance in response to the acceleration of the target object, also move to vary the capacitance when the elastic modulus of the adhesive film 4 changes relatively significantly or when a relatively great thermal stress is generated in the sensing microchip 5. Therefore, as shown in FIGS. 3 and 4, a reference acceleration sensor including a polyimide-type adhesive film, the elastic modulus of which changes relatively significantly at approximately 110° C. due to the glass transition as shown in FIG. 5, provides relatively great measurement errors in acceleration and sensitivity. The reference acceleration sensor has the same structure as the acceleration sensor S1 in FIG. 1, except that the polyimide-type adhesive film is used. The reference acceleration sensor has the same dynamic range, the upper limit of which is 1.5 g's, as the acceleration sensor S1.

Figure 6:
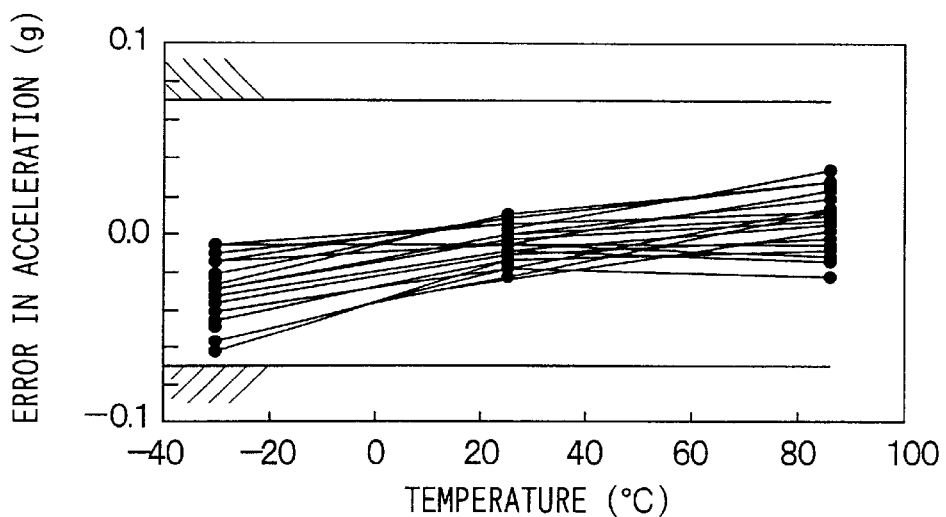
FIG. 6 is a graph showing the correlation between the initial error in acceleration and temperature of the acceleration sensor according to the embodiment.
Figure 7:
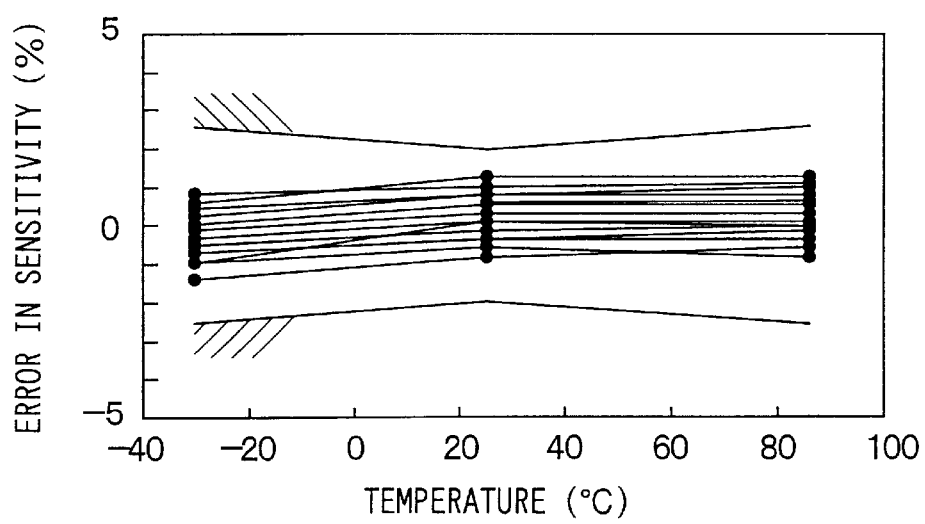
FIG. 7 is a graph showing the correlation between the initial error in sensitivity and temperature of the acceleration sensor according to the embodiment.

On the other hand, as shown in FIG. 2, the elastic modulus of the silicone-type adhesive film is much lower and more stable than that of the polyimide-type adhesive film, so the thermal stress is preferably low and stable in the acceleration sensor S1 in FIG. 1. Therefore, as shown in FIGS. 6 and 7, the acceleration sensor S1 in FIG. 1 provides smaller errors in acceleration and sensitivity than the reference acceleration sensor. In FIGS. 3 and 6, a tolerance range is shown by the tolerance lines, which are drawn on a basis of tolerances (+−50 mV) in the deviation $D_{vol}$. In FIGS. 4 and 7, a tolerance range is shown by the tolerance lines, which are drawn on a basis of tolerance (+−1.4%) in error in the sensitivity. In FIGS. 3, 4, 6, and 7, a plurality of measurement results at −30° C., +25° C., and 85° C. from a plurality of acceleration sensors S1 and a plurality of reference sensors are plotted. All measurement results from the acceleration sensors S1 are in the tolerance ranges, as shown in FIGS. 6 and 7.

The acceleration sensor S1 in FIG. 1 is manufactured as follows. After the adhesive 2 is coated on an inner surface of the housing 1, the processing microchip 3 is placed on the adhesive 2. Then, the adhesive 2 is cured. It is preferred that beads having a predetermined particle size are preliminarily added to the adhesive 2 to homogenize the thickness of the adhesive 2 and support relatively precisely the processing microchip 3 on a predetermined level.

Subsequently, the adhesive film 4 and the sensing microchip 5 are mounted one by one in this order on the bonding area 3a of the processing microchip 3. Alternatively, after a sheet including a plurality of adhesive films 4 are adhered to a wafer including a plurality of sensing microchips 5, the wafer and the sheet are diced and separated into a plurality pairs of the sensing microchip 5 and the adhesive film 4, and then one of the pairs is mounted en bloc on the bonding area 3a.

If a liquid adhesive is used instead of the adhesive film 4, bonding pads of the processing microchip 3, to which the bonding wires 6, 7 are bonded, can be polluted by polymers having lower molecular weight, which bleed from the liquid adhesive, and wire-bonding quality can be lowered. In the acceleration sensor S1 in FIG. 1, the sensing microchip 5 and the processing microchip 3 are not bonded with the liquid adhesive, but with the adhesive film 4. Therefore, there is an advantage that the wire-bonding quality is not lowered by the pollution in the acceleration sensor S1 in FIG. 1.

After the adhesive film 4 and the sensing microchip 5 are mounted on the bonding area 3a of the processing microchip 3, the adhesive film 4 is cured to bond relatively firmly and durably the microchips 3, 5. Then, the microchips 3, 5 and the housing 1 are electrically connected by the bonding wire 6, 7, which are made of gold or aluminum, to complete the acceleration sensor S1 shown in FIG. 1.

Modifications

The present invention may be applied to electronic devices such as an angular speed sensor, a pressure sensor, a temperature sensor, or an optical sensor by replacing the sensing microchip 5 with corresponding sensing microchips. In addition to the C/V transducing circuit, the processing microchip 3 may include a memory circuit, which is formed using transistors such as a MOSFET and a bipolar transistor. In the acceleration sensor S1 in FIG. 1, the sensing microchip 5 is stacked on the processing microchip 3. However, the stacking structure may be opposite, that is, the processing microchip 3 may be stacked on the sensing microchip 5. The present invention may also be applied to an electronic device in which two sensing microchips are stacked or two processing microchips are stacked.

What is claimed is:

1. An electronic device comprising:

a first microchip having a bonding area;

a second microchip; and a bonding layer, which is in contact with the first and second microchips to bond the first and second microchips at the bonding area, wherein the bonding layer has a glass transition temperature higher than +120° C. or lower than −40° C. to substantially eliminate an influence of the variation in the elastic modulus of the bonding layer due to the glass transition on an electronic characteristic of the second microchip in the temperature range between −40° C. and +120° C.

2. The electronic device in claim 1, wherein the bonding layer is a silicone-type adhesive film.

3. The electronic device in claim 1, wherein the second microchip outputs an electric signal in response to an acceleration of a target object, wherein the acceleration is detected on a basis of the electric signal, and wherein an upper detection limit of the acceleration is in the range between 0.3 g's and 1.5 g's.

4. The electronic device in claim 1, wherein the glass transition temperature is lower than −40° C.

5. The electronic device in claim 1, wherein the elastic modulus is smaller than 10 MPa in the temperature range between −40° C. and +120° C. to suppress an influence of a thermal stress in the second microchip on the electronic characteristic.

6. The electronic device in claim 5, wherein the elastic modulus is in the range between 1 MPa and 10 MPa.

* * * * *